United States Patent [19]

Prabhakar et al.

[11] Patent Number: 4,813,840

[45] Date of Patent: Mar. 21, 1989

[54] METHOD OF ALIGNING WAFERS AND DEVICE THEREFOR

[75] Inventors: Rakesh Prabhakar, Castro Valley, Calif.; A. Fernando Benavides, Round Rock, Tex.; Petru Nitescu, Fremont; Peter Ebbing, Los Altos, both of Calif.

[73] Assignee: Applied Materials, Inc., Santa Clara, Calif.

[21] Appl. No.: 84,371

[22] Filed: Aug. 11, 1987

[51] Int. Cl.$^4$ .............................................. B65G 47/24
[52] U.S. Cl. .................................. 414/433; 198/344; 414/757; 414/786
[58] Field of Search ...................... 414/433, 757, 786; 198/394

[56] References Cited

U.S. PATENT DOCUMENTS

| | | | |
|---|---|---|---|
| 3,297,134 | 1/1967 | Pastuszak | 414/757 X |
| 3,982,627 | 9/1976 | Isohata | 414/757 |
| 4,311,427 | 1/1982 | Coad et al. | 414/417 X |
| 4,376,482 | 3/1983 | Wheeler et al. | 198/394 |
| 4,441,853 | 4/1984 | Kosugi | 414/757 |
| 4,662,811 | 5/1987 | Hayden | 414/757 X |

OTHER PUBLICATIONS

"Semiconductor Wafer Alignment Fixture", IBM Technical Disclosure Bulletin, vol. 10, No. 6, Nov. 1967.

"Precision Wafer Orientation and Transfer System", IBM Technical Disclosure Bulletin, vol. 16, No. 9, Feb. 1974.

*Primary Examiner*—Leslie J. Paperner
*Attorney, Agent, or Firm*—Flehr, Hohbahc, Test, Albritton & Herbert

[57] ABSTRACT

A cassette of conventional form is loaded with a plurality of semiconductor wafers having indexing flats of the known type and placed over three parallel rollers rotatably secured to a frame. The three rollers include a center roller and two side rollers positioned only slightly higher than the center roller such that their rotary motions can be communicated to the wafers by contact, depending on the position of the individual indexing flats. The indexing flats are roughly aligned in downward directions first by rotating only the center roller and after all three rollers are rotated to bring the indexing flats in upward directions, the wafers are more accurately aligned in a downward direction by rotating only the center roller and all three rollers are rotated thereafter for a predetermined period of time, depending on the desired angular position of the indexing flats.

16 Claims, 4 Drawing Sheets

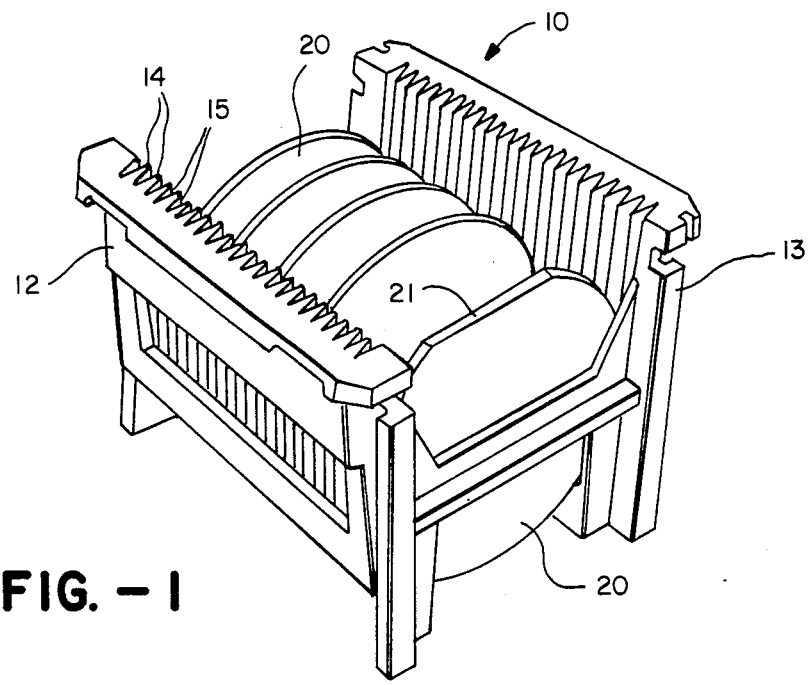
FIG.—1
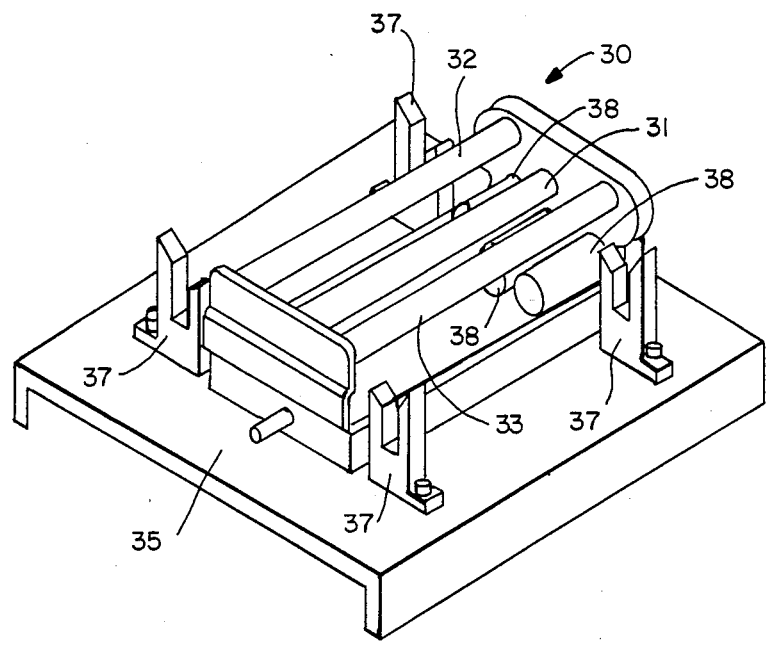
FIG.—2

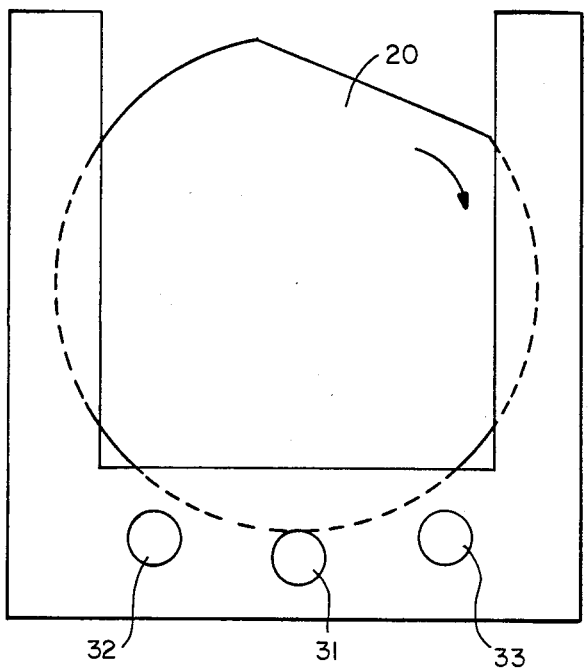
FIG.—3A
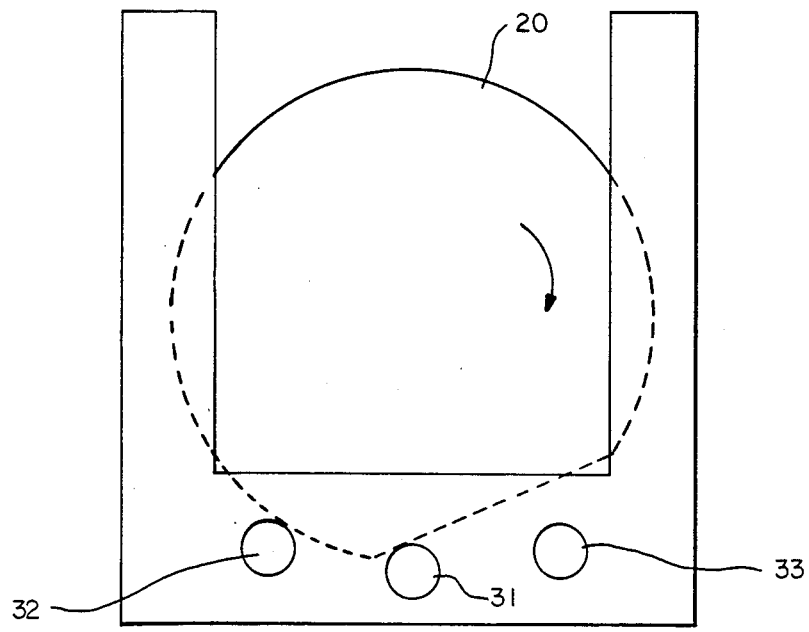
FIG.—3B

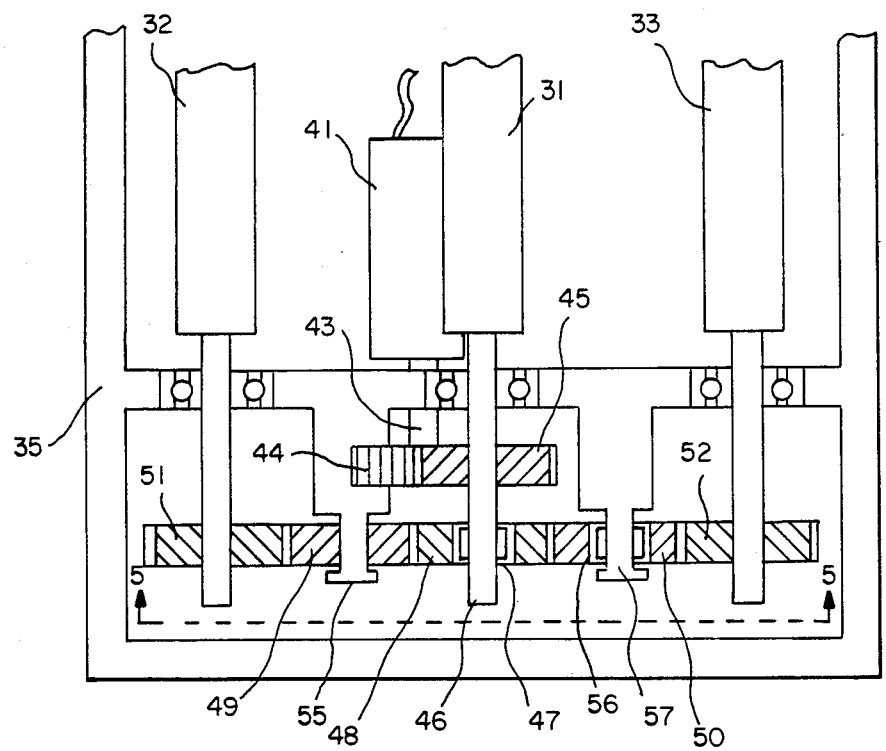
FIG.—4
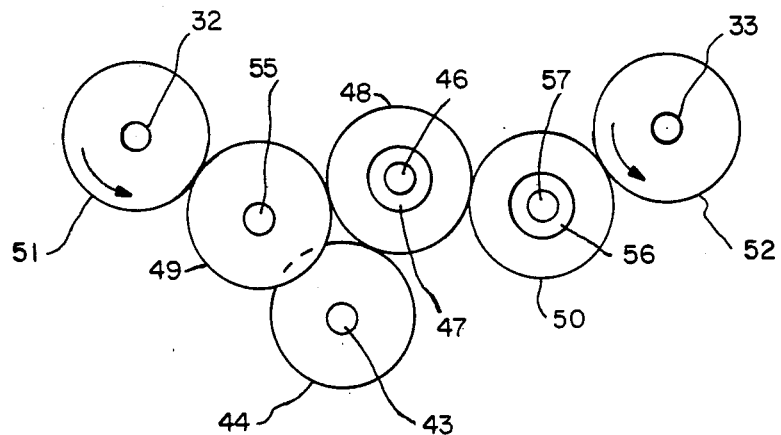
FIG.—5

METHOD OF ALIGNING WAFERS AND DEVICE THEREFOR

BACKGROUND OF THE INVENTION

This invention relates to a method of aligning disks having a flat section and a device therefor. More particularly, this invention relates to a method of and a device for aligning semiconductor wafers of the usual shape having indexing flats such that their flats can be uniformly oriented in a specified angular direction inside a cassette.

In manufacturing integrated circuit structures by modern techniques, semiconductor wafers are transported to various processing stations and handled in different manners. Since these structures are extremely contamination-sensitive especially in dense, complex LSI and VLSI circuits, many automated wafer-handling apparatus have been proposed, for example, in U.S. Pat. Nos. 4,311,427 and 4,449,885. In U.S. patent application Ser. No. 693,722 filed Jan. 22, 1985 and assigned to the present assignee, there is disclosed a robotic wafer-handling mechanism whereby wafers are sequentially taken out of a cassette of a conventional form and placed individually on a pedestal for ion-implantation. Since wafers of the conventional shape are generally circular and provided with a flat edge formed along a chord (which has been variously referred to, for example, as "a guide flat" and "an indexing flat"), each pedestal is also formed substantially in the same shape as the wafer so that its surface will be completely shielded from impinging ions by a wafer placed thereon. In order to successfully shield the pedestal surfaces, therefore, each wafer must be correctly oriented with respect to the pedestal onto which it is placed. Since the mechanism for transferring wafers from a cassette to the pedestals is not equipped with a "wrist" to control the orientation of the flat section of each wafer, the wafers must be aligned with their flat sections oriented in a proper direction before they are brought to this robotic wafer-handling apparatus.

Various devices have heretofore been proposed for aligning disks such as semiconductor wafers of the type having an indexing flat along a chord. Mechanisms for aligning wafers singly have been described, for example, in U.S. Pat. Nos. 3,297,134, 3,982,627 and 3,997,065. Aforementioned U.S. Pat. No. 4,311,427 discloses a device for aligning a plurality of wafers simultaneously while they are supported vertically in a conventional cassette. This simple device makes use of a pair of opposed rollers to find the flats and to orient them uniformly in the downward direction. It is not adapted to align the wafers in a specified angular direction. More recently, U.S. Pat. No. 4,662,811 disclosed apparatus capable of orienting the flats of wafers nearly in any position. In order to keep the wafers rotating, however, rollers with a non-circular cross-section and rollers which must be moved vertically up and down were introduced. Apparatus with such rollers are more difficult to design to avoid wafer surface contamination due to the mechanisms required and expensive to manufacture.

SUMMARY OF THE INVENTION

It is therefore an object of the present invention to provide a simple method of aligning a plurality of wafers and a device therefor.

It is another object of the present invention to provide a method of and device for aligning a plurality of wafers such that their indexing flats are at a specified angular position.

It is a further object of the present invention to provide a method of and device for aligning a plurality of wafers having indexing flats by means of simple rollers which are rotatably affixed to a frame.

The above and other objects of the present invention are achieved by placing such wafers in a cassette of a conventional form and setting such a loaded cassette on a device of the present invention provided with three parallel rollers including a center roller and two side rollers. The side rollers are positioned somewhat higher than the center roller but such that wafers supported vertically in the cassette by one or both of its sidewalls normally touch only the center roller and hence can be rotated only by the motion thereof unless their indexing flats are in downward direction. The center roller alone is rotated initially to roughly align the wafers such that all indexing flats are at downward angular positions. After all three rollers are rotated thereafter for a predetermined period of time to bring the indexing flats to upward directions, only the center roller is rotated until all indexing flats are aligned in a downward direction. Finally, all three rollers are rotated for a specified period of time according to the desired angular position of the aligned indexing flats.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a perspective view of a cassette which is loaded with wafers and is adapted to be set on a wafer aligning device of the present invention, FIG. 2 is a schematic perspective view of essential components of a wafer aligning device embodying the present invention, FIGS. 3A-3D are schematic sectional views of a wafer in the cassette of FIG. 1 with its indexing flat in different angular positions, FIG. 4 is a schematic top view of a gear train mechanism adapted for the transmission of motion of a motor to the rollers of a wafer aligning device according to the present invention and, FIG. 5 is a schematic front view taken along the line 5—5 of FIG. 4.

DETAILED DESCRIPTION OF THE INVENTION

Figure 3C:
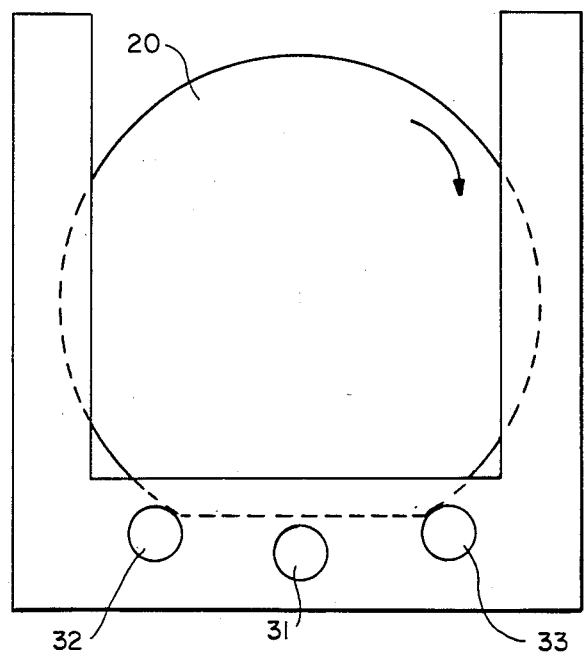

The present invention relates to a method of and a device for aligning disk-like wafers of an ordinary shape with an indexing flat and supported in a cassette of a conventional form. FIG. 1 shows, for the sake of completeness, such a conventional cassette 10 which may be used in connection with the present invention, having a pair of substantially vertical sidewalls 12 and 13 opposite to each other with a plurality of ribs 14 formed on their inner surfaces to define grooves 15 therebetween such that wafers 20, each with an indexing flat 21 across a chord, are supported substantially vertically therein in mutually spaced apart and substantially coaxial relationship. The cassette 10 is open at the top such that wafers 20 can be easily loaded and unloaded therethrough and also over a substantial portion of its bottom to permit access from below to the wafers 20 supported therein. The flats 21 of the wafers 20, when the cassette 10 is initially loaded, are not expected to be uniformly oriented, and this situation is depicted in FIG. 1.

Figure 3D:
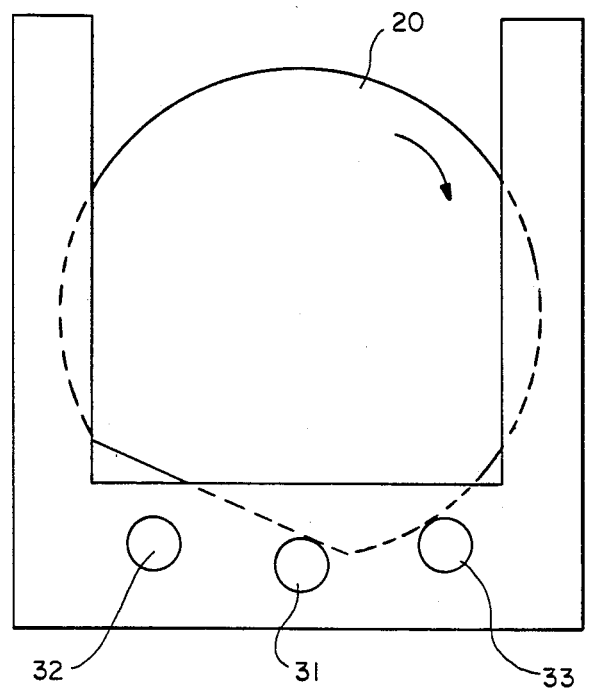

FIG. 2 is a schematic perspective view of a wafer aligning device 30 which embodies the present invention, showing only its essential components for simplicity. Three cylindrical rollers including a center roller 31 and two side rollers 32 and 33 which symmetrically flank the center roller 31 are rotatably supported by a frame 35 horizontally and in mutually parallel fixed relationship. Also affixed to the frame 35 are grooved cassette-supporting pieces 37 by which the cassette 10 can be secured to the frame 35 such that the rollers 31, 32 and 33 are substantially perpendicular to the surfaces of the wafers 20 in the cassette 10. The two side rollers 32 and 33 are positioned slightly higher than the center roller 31. The difference in height between them is shown somewhat exaggeratedly in FIG. 2. Realistically, the difference in height between the center roller 31 and the side rollers 32 and 33 is determined with respect to the horizontal separation therebetween such that those of the wafers 20 with the indexing flats 21 in upward directions as shown in FIG. 3A engage only with the center roller 31, leaving small gaps above the side rollers 32 and 33. The relative positions of the three rollers 31, 32 and 33 are further so determined that those of the wafers 20 with indexing flats 21 in downward directions may touch one or both of the side rollers 32 and 33 as shown in FIGS. 3B, 3C and 3D.

The choice of roller surface material is critical. It is well understood that both slippage between the rollers and the wafers and contamination of the wafers by particulates must be prevented. Slippage between the rollers and the wafers not only generates particulates but also makes it impossible to accurately control the angular positions of the wafers by the rotary motions of the rollers. For this reason, it is desirable to ensure rolling contacts between the roller surfaces and the peripheries of the wafers whenever such contacts are required for the purpose of transmitting force and motion. In the situation of FIG. 3A, for example, rolling contact is essential between the center roller 31 and the wafer 20, there being no particulate-generating sliding contact between the side rollers 32 and 33 and the wafer 20. Although such slippage can be reduced to a certain extent by properly selecting the relative positions of the rollers, a soft, compliant material providing a higher coefficient of friction between the side surfaces of the rollers 31, 32 and 33 and the peripheries of the wafers 20 is generally considered desirable from the point of view of preventing slippage between the wafers and the rollers. On the other hand, compliant materials tend to be less abrasion-resistant and hence to produce more particulates which contaminate the wafer environment and harder, less compliant materials are desirable from this point of view. According to the present invention, these two points of view are considered and 75-80 durometer polyurethane is used as the roller surface material. This choice, however, is not intended to limit the scope of this invention. In the situations depicted in FIGS. 3B, 3C and 3D, rolling contacts are more easily achievable because the wafer 20 is in contact with two of the rollers.

With reference to FIG. 2 again, the three rollers 31, 32 and 33 are individually provided with a DC motor 38 for achieving individual control thereof. It will be assumed hereinbelow, for the purpose of explanation, that the rollers 31, 32 and 33 are all adapted to rotate in the counter-clockwise direction with reference to FIGS. 3A through 3D, such that the wafers 20 peripherally in contact therewith are adapted to rotate in the clockwise direction as shown by the arrows.

To make use of the device 30 to align in a given flat orientation a plurality of wafers for which the device 30 is designed, any number of such wafers 20 are loaded in a cassette 10 of a conventional form shown in FIG. 1 and the loaded cassette 10 is set on the frame 35, secured by means of the grooved pieces 37 fastened thereon. In this initial condition, the loaded wafers 20 are generally oriented at random. Some of the wafers, being supported from the sides by the substantially vertical sidewalls 12 and 13 and having their indexing flats 21 in upward directions as shown in FIG. 3A, are in touch, and hence in motion-communicating relationship only with the center roller 31. The others, having their indexing flats 21 in downward directions, touch one or both of the side rollers 32 and 33 and may or may not be in motion-communicating relationship with the center roller 31 as shown in FIGS. 3B, 3C and 3D.

With the wafers 20 thus oriented at random inside the cassette 10 and the cassette 10 being set on the frame 35 over the rollers 31, 32 and 33, the center roller 31 is rotated in the counter-clockwise direction by the DC motor 38 associated therewith. Because of the friction between the cylindrical side surfaces of the center roller 34 and the peripheries of the wafers 20, those of the wafers 20 initially in contact with the center roller 31 are caused to rotate in the clockwise direction. Those not in contact with the center roller 31 as shown, for example, in FIG. 3C, however, are not affected by the motion of the center roller 31 and maintain their initial positions. Those in contact both with the center roller 31 and the left-hand side roller 32 but not with the right-hand side roller 33 as shown in FIG. 3B will continue to rotate only until the gravitational force on the center roller 31 is reduced to such an extent that the frictional force from the center roller 31 becomes insufficient to overcome friction against the left-hand side roller 32 and the sidewalls 12 and 13. In summary, if the center roller 31 is rotated for a period which would be long enough to cause a fully circular wafer of the same size to make a nearly complete rotation, all wafers 20 in the cassette 10, which may be randomly oriented at first, will be either in the position depicted in FIG. 3C or in a balanced position described above which is reached shortly after the wafer assumes the position depicted in FIG. 3B. Since the angle of the indexing flat 21 with the horizontal direction at this "balanced" condition is less than 10°, the wafers 20 in this condition may be considered to have been aligned within this margin of error and, if errors in this range are tolerated, all three rollers 31, 32 and 33 are thereafter rotated together at the same rate by activating the motors 38. Since every wafer in the cassette 10 is in contact with at least one of the rollers 31, 32 and 33, all wafers rotate at the same rate. Thus, by running the motors 38 for an appropriate length of time, the wafers 20 can be re-aligned in any angular position within the margin or error mentioned above. The length of time during which the motors 38 are run is determined by the desired orientation of the indexing flats 21 and the speed of rotation of the wafers.

The present invention relates also to a method of reducing the aforementioned margin of error, this method being based on the observation that this margin of error comes about because the wafer orientations are totally random when the step of rotating only the center roller 31 is started. According to an improved method of aligning the wafers, therefore, the wafers 20, which are randomly oriented in the cassette 10 at the beginning, are roughly aligned by rotating only the center roller 31 as described above until all wafers come to assume the position of FIG. 3C or the aforementioned balanced position. This step will be referred to as a preliminary step in the claims, and the wafers at the end of this preliminary step are aligned with respect to one another within a margin of error of less than 10° as mentioned above.

Thereafter, all three rollers 31, 32 and 33 are rotated together as explained above, but only for a predetermined period of time such that all wafers 20 in the cassette 10 have indexing plate 21 in upward directions as shown in FIG. 3A or are at least in motion-communicating relationship with the center roller 31 at the end of this period. After this condition is established, the rotation of the side rollers 32 and 33, which are no longer in contact with the wafers 20, is stopped and the center roller 31 alone continues to rotate until all wafers 20 reach the condition depicted in FIG. 3B and then to the aforementioned balanced condition wherein the rotary motion of the center roller 31 cannot move the wafers 20 any further. At this moment, there is no wafer 20 in the cassette 10 which is positioned as depicted in FIG. 3C because, the side rollers 32 and 33 being stationary, the center roller 31 alone cannot act on a wafer in the position of FIG. 3B to bring it into the position of FIG. 3C. In summary, the aforementioned margin of error caused by the presence of wafers initially in the position shown in FIG. 3C can be eliminated by this preliminary step of running the center roller 31 until all wafers are roughly aligned and then rotating all three rollers 31, 32 and 33 until the wafers are all in positions shown in FIG. 3A. Finally, all three rollers 31, 32 and 33 are rotated, as described above, for a period of time determined by the desired angular position of the indexing flats 21. They are stopped by a controlled deceleration of the roller driving mechanism. The controlled deceleration prevents continued (uncontrolled) rotation by the wafer due to inertia and results in high precision of desired angular position.

The foregoing description of a preferred embodiment of the invention has been presented for purposes of illustration and description. It is not intended to be exhaustive or to limit the invention to the precise form disclosed, and many modifications and variations are possible in light of the above teaching. In particular, it is to be reminded that FIGS. 3A-3D are intended to be schematic and hence only to show the basic principle of the invention. According to a preferred embodiment of the present invention for wafers of 150 mm in diameter in the circular portion, use was made of rollers of about 9.5 mm in diameter with the horizontal separations between the center roller and the side rollers (center-to-center distances) about 33.3 mm and the side rollers positioned higher than the center roller by about 4.7 mm. Experiments with this embodiment of the present invention have shown that 25 wafers in a cassette could be aligned to better than about 3° for a cycle time of about 15 seconds over 35000 cycles. It has also been noted that cassette misalignment of up to about 2.2 mm with respect to the frame did not significantly affect the aforementioned results of alignment experiment. Moreover, it was noted that variations of up to 25% in the speed of the three motors 38 had no effect on the performance. It is not necessary, however, to provide three independent motors to drive the three rollers 31, 32 and 33. In order to correlate the rotary motion of the two side rollers 32 and 33, a motion-communicating means may be provided to synchronize their operations as shown, for example, in aforementioned U.S. Pat. No. 4,662,811.

In FIGS. 4 and 5, there is shown an alternative motion-communicating mechanism by which the motion of the three rollers 31, 32 and 33 can be controlled by a single motor 41 mounted to the frame 35. With reference to FIGS. 4 and 5 wherein parts which are identical or equivalent to those shown in FIG. 2 are indicated by the same numerals, numeral 43 indicates the shaft of the motor 41 to which is affixed a gear 44 adapted to drive another gear 45 affixed to the shaft 46 of the center roller 31. Numeral 47 indicates an overrunning roller clutch or equivalent sprag clutch affixed axially capturingly to this shaft 46 on which it is free to rotate (such as clockwise rotation for the purpose of illustration hereinbelow) but to which it is locked in the other direction. A roller clutch of this kind is commercially available, for example, from The Torrington Company of Torrington, Conn. 06790. The clutch 47 is also rigidly affixed inside another gear 48 adapted to drive two gears 49 and 50 which, in turn, drive gears 51 and 52, respectively affixed to the shafts of the side rollers 32 and 33. The gear 49 is free to rotate on a spindle 55 affixed to the frame 35 and the gear 50 has a clutch 56 affixed in its bore and captured on a spindle 57 also affixed to the frame 35. The clutch 56 is preferably identical to the clutch 47 and is not locked to the spindle 57 when the gear 50 is rotated in the clockwise direction. All gears are preferably identical relative to their teeth characteristics and the material of mating gears are preferably dissimilar. Gear ratios must be chosen such that when all three rollers 31, 32 and 33 are driven, all surface speeds are identical. When the direction of rotation of the motor 41 is reversed from that indicated in FIG. 5, the clutch 47 is decoupled from the shaft 46. To ensure that the torsional drag between the shaft 46 and the clutch 47 will not drive the side rollers 32 and 33 when the motor 41 rotates in the counterclockwise direction, the clutch 56 is incorporated in the gear train layout. The advantage of this motion-communicating mechanism is that optimum angular orientation of the wafers can be obtained by a single motor which may be equipped with a shaft encoder. The entire gear train can be constructed from readily available commercial parts except the gears 48 and 50 are modified to fit the clutches 47 and 56. Possible synchronization problems between roller surfaces are thus eliminated. Coupling of the clutch 47 to its shaft 46 occurs in less than 20' (minutes) of shaft rotation for this type of clutch and clutch loading. The entire gear train including the motor 41 can be sealed inside a housing. As variations of the embodiment shown in FIGS. 4 and 5, the clutch 56 may be affixed on the spindle 55 instead, and the motor 41 may be connected to drive the center roller 31 so that gears 44 and 45 can be dispensed with.

More generally, the three rollers 31, 32 and 33 for supporting and controllably rotating the wafers 20 need not be of the same diameter. When it is broadly stated that the two side rollers 32 and 33 are positioned higher than the central roller 31, therefore, it is to be understood that their relative heights do not refer to their fixed axes of rotation but to the upper peripheral surfaces where motion-communicating relationship may be established with a wafer. Any such modifications and variations that may be apparent to a person skilled in the art are intended to be include within the scope of this invention.

What is claimed is:

1. A device for aligning disks in a specified angular orientation, said disks each having a generally circular periphery with a predetermined curvature and an indexing flat of a predetermined length along a chord, said disks being supported substantially vertically in a substantially horizontally disposed cassette in mutually spaced apart and substantially coaxial relationship, said cassette being substantially open at bottom such that said disks supported in said cassette are accessible from below, said device comprising a frame adapted for said cassette to be set substantially horizontally thereon, a center roller and two side rollers which flank said center roller, said rollers being rotatably supported around axes which are unchangeably fixed with respect to each other and to said frame and each adapted to impart frictional force to said wafers in said cassette through contacts with the peripheries thereof, said rollers being so positioned with respect to said frame that, when said cassette is set on said frame, those of said wafers with the indexing flats not oriented in a downward direction contact said center roller without touching either of said side rollers and those of said wafers with the indexing flats oriented in a downward direction all have their generally circular peripheries in contact with one or both of said side rollers, and driving means for selectively causing said rollers to rotate.

2. The device of claim 1 wherein said side rollers have higher peripheral surface position than said center roller has.

3. The device of claim 1 wherein said driving means include three motors which are individually in motion-communicating relationship with said rollers.

4. The device of claim 1 further comprising motion-communicating means for correlating the rotary motion of said side rollers.

5. The device of claim 4 wherein said driving means include a single motor and said motion-communicating means include a gear train.

6. The device of claim 5 wherein said gear train includes a center-axis gear which is affixed to the axis of said center roller and side-axis gears which are respectively affixed to and rotate with said side rollers, said center-axis gear being adapted to rotate freely around the axis of said center roller when said center roller rotates in one direction but to lock thereonto when said center roller rotates in the other direction, said center-axis gear being in motion-communcatably engaged relationship with said side-axis gears.

7. The device of claim 1 wherein said rollers have surfaces made from a compliant material.

8. The device of claim 1 wherein said rollers comprise 75-80 durometer polyurethane.

9. The device of claim 1 wherein said central and side rollers have same diameter.

10. A method of aligning disks in a specified angular orientation, said disks each having a generally circular periphery with a predetermined curvature and an indexing flat of a predetermined length along a chord, said disks being supported substantially vertically in mutually spaced apart and substantially coaxial relationship, said method comprising the steps of setting a cassette on a frame, said cassette being loaded with said disks and adapted to support said disks substantially vertically and in mutually spaced apart and coaxial relationship, said cassette being substantially open at bottom such that said disks supported therein are accessible from below, a center roller and two side rollers which flank said center roller being rotatably supported around axes which are fixed with respect to said frame, said rollers being so positioned with respect to said frame that, when said cassette is set on said frame, those of said disks with the indexing flats not oriented in a downward direction contact said center roller without touching either of said side rollers and those of said wafers with the indexing flats oriented in a downward direction contact one or both of said side rollers, causing said wafers to rotate by rotating only said center roller until the indexing flats of all said wafers in said cassette are oriented in approximately downward directions, and causing all three of said rollers to rotate until said specified angular orientation is achieved.

11. The method of claim 10 wherein said wafers are rotated substantially through rolling contact with one or more of said rollers.

12. The method of claim 10 wherein said side rollers have higher peripheral surface position than said center roller has.

13. The method of claim 10 further comprising the step of preliminarily rotating said center roller with said side rollers kept stationary until said indexing flats of all said wafers in said cassette are in approximately downward directions, and then rotating all three of said rollers together for a predetermined length of time to re-orient said indexing flats from said downward directions.

14. The method of claim 13 wherein said side rollers have higher peripheral surface position than said center roller has.

15. The method of claim 10 further comprising the step of stopping the rotation of said rollers by controlling deceleration.

16. The method of claim 13 further comprising the step of stopping the rotation of said rollers by controlling deceleration.

* * * * *